United States Statutory Invention Registration [19]

[11] Reg. Number: H208

[43] Published: Feb. 3, 1987

Ng et al.

[54] PACKAGING MICROMINIATURE DEVICES

[75] Inventors: Kwok K. Ng, Union; Simon M. Sze, Berkeley Heights, both of N.J.

[73] Assignee: AT&T Bell Laboratories, Murray Hill, N.J.

[21] Appl. No.: 581,336

[22] Filed: Feb. 17, 1984

[51] Int. Cl.[4] ..... H01L 23/16; H01L 29/04; H01L 21/00

[52] U.S. Cl. ..... 357/75; 357/68; 357/60; 29/576 J

[58] Field of Search ..... 357/75, 68, 60, 80, 357/74

[56] References Cited

U.S. PATENT DOCUMENTS

| | | | |
|---|---|---|---|
| 3,761,782 | 9/1973 | Youmans | 357/68 |
| 4,021,838 | 5/1977 | Warwick | 357/68 |
| 4,057,824 | 11/1977 | Woods | 357/68 |
| 4,074,342 | 2/1978 | Honn et al. | 357/68 |
| 4,360,823 | 11/1982 | van Gils | 357/68 |
| 4,491,856 | 1/1985 | Egawa et al. | 357/68 |
| 4,525,732 | 6/1985 | Bayraktaroglu | 357/68 |

FOREIGN PATENT DOCUMENTS

| | | | |
|---|---|---|---|
| 58-143556 | 8/1983 | Japan | 357/75 |

OTHER PUBLICATIONS

"Wafer-Chip Assembly for Large-Scale Integration", *IEEE Transactions on Electron Devices*, vol. ED-15, No. 9, P. Kraynak et al, Sep. 1968, pp. 660-663.

"Fabricating Shaped Grid and Aperature Hole", Leone, IBM Tech. Disclosure, vol. 14, No. 2, Jul. 1971, pp. 417-418.

"Merging Semiconductor Optoelectronics with Silicon Technology", Fang et al., IBM Technical Disclosure, vol. 19, No. 10, Mar. 1977, pp. 3959-3960.

*Primary Examiner*—Stephen C. Buczinski
*Assistant Examiner*—Linda J. Wallace
*Attorney, Agent, or Firm*—Lucian C. Canepa

[57] ABSTRACT

One or more silicon-integrated-circuit chips are attached, active side up, to the top side of a silicon wafer. The top side of the wafer and all but peripheral portions of the attached chip(s) are then coated with an etch-resistant layer. Subsequently, the chips are etched to form sloped edges between the active areas of the chips and the top side of the wafer. A lithographically defined conductive pattern is then formed on the top side of the wafer and on the sloped edges to connect conductive pads on each chip to conductive pads on other chips and/or to conductive terminals disposed along the periphery of the wafer. In other embodiments, at least one chip of the type described is attached to each side of a wafer. In such embodiments, connections can also be made through vias in the wafer to selectively interconnect pads and/or terminals included on both sides of the wafer. The resulting packaged chip assembly has advantageous performance and cost characteristics.

19 Claims, 8 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PACKAGING MICROMINIATURE DEVICES

BACKGROUND OF THE INVENTION

This invention relates to packaging microminiature devices and, more particularly, to a packaging assembly and a method in which one or more devices are affixed to and interconnected on a wafer.

Conventional integrated-circuit chip interconnection techniques involve the use of wire bonds between peripherally disposed pads on the chip and an associated lead frame that includes rigid terminal members. In turn, the lead frame is mounted in a chip package. The rigid terminals of one or more such packaged chips are then inserted into corresponding apertures in a ceramic board or card that contains a thin-film interconnection pattern.

An alternative packaging technique for achieving a very-high-density interconnection of active silicon-integrated-circuit devices without the use of wire bonds has been heretofore proposed. The alternative is directed at permitting the fabrication of large electronic subsystems in essentially monolithic form, as described, for example, in "Wafer-Chip Assembly for Large-Scale Integration," *IEEE Transactions on Electron Devices,* Vol. ED-15, No. 9, September 1968, pp. 660-663.

In the assembly described in the aforecited article, chips are face-down bonded onto a silicon wafer that contains interconnect lines. The same lithographic technology is used on the wafer as on the chips to obtain a very-high-packing density and a relatively low-inductance assembly. The face-down bonding permits access to each chip at points other than the periphery of the chip, thereby requiring only a relatively small part of the overall chip area for interconnect lines.

In the face-down bonding operation, conductive pads on each chip are bonded to corresponding pads included in the interconnect pattern on the wafer. To form such bonds between each chip and the wafer, a metallic bump is typically formed on the chip, or on the wafer, or on both. In practice, however, lack of uniformity in bump height and relatively poor long-term stability characteristics of the bump technology make this bonding approach unattractive for many high-reliability applications of practical importance. Moreover, the area required for the bumps on mating contact pads on the chip and wafer is extremely large relative to the micron and submicron dimensions that are becoming increasingly the goal of much integrated circuit design work.

In another known approach, flowable solder balls are utilized in a face-down bonding technique to form connections between chip and wafer pads. In practice, this approach tends to minimize the aforementioned problem of lack of uniformity in bump height. But this approach does not generally satisfy the goal of achieving extremely small-area connections between the chip and wafer pads.

For the aforestated reasons, workers in the art have continued their efforts directed at trying to further improve the packaging of integrated-circuit devices. It was recognized that these efforts, if successful, had the potential for significantly decreasing the cost and increasing the performance characteristics of such devices.

SUMMARY OF THE INVENTION

Hence, an object of the present invention is to improve the packaging of integrated-circuit devices. More specifically, an object of this invention is an improved packaging assembly for mounting and effecting electrical connections to integrated-circuit devices and to a method for fabricating such an assembly.

Briefly, these and other objects of the present invention are realized in a specific illustrative assembly and to a fabrication method in which at least one microminiature device is mounted, active surface up, to the top side of a wafer. Conductive pads are located in a central portion of the top surface of the mounted device. The top side of the wafer and all but peripheral portions of the attached devices(s) are then coated with an etch-resistant layer. Subsequently, each device is etched to form sloped edges between the active area of the device and the top side of the wafer. By utilizing standard conformal integrated-circuit fabrication techniques, conductive patterns are defined and formed on the top side of the wafer and on at least one of the sloped edges to connect the device pads to pads on other devices and/or to conductive terminals disposed along the periphery of the wafer. The wafer-size assembly thus made is further processed (for example, encapsulated) in conventional ways and is then available as a monolithic component exhibiting advantageous performance and cost characteristics.

In other embodiments of applicants' invention, at least one microminiature device of the type described is mounted on each side of a wafer. Additionally, connections may be established between devices mounted on the two sides of the wafer. In these ways, a particularly compact and dense wafer-size assembly is realized.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
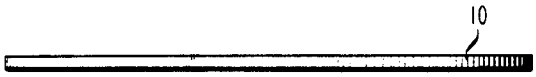
FIGS. 1 through 8 are schematic representations, not drawn to scale, of portions of a specific illustrative assembly made in accordance with the principles of the present invention.

FIG. 1 shows a wafer 10 that constitutes an integral part of an assembly made in accordance with the principles of the present invention. Advantageously, the wafer 10 comprises a disc about 75 to 150 millimeters in diameter, with a thickness t of approximately 0.5 millimeters. Illustratively, the wafer 10 comprises a monocrystalline silicon wafer.

Figure 2:
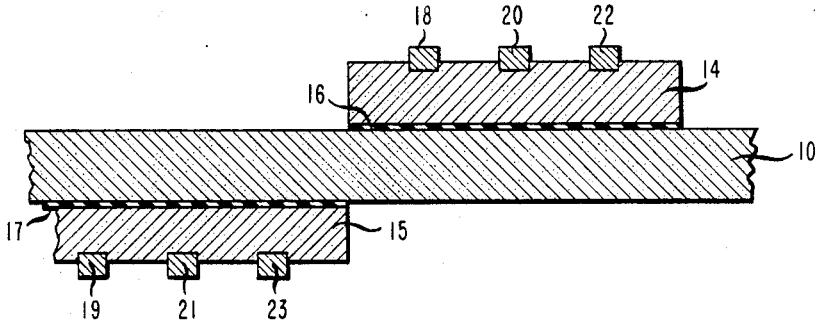

FIG. 2 shows in enlarged form a portion of the aforedescribed wafer 10. Additionally, FIG. 2 depicts a microminiature device, for example a silicon-integrated-circuit chip 14, adhered to the top of the wafer 10 by means of a bonding layer 16. By way of example, the layer 16 comprises an adhesive material such as a conventional polyimide material or a silicon dioxide layer. Illustratively, the layer 16 is spun on the bottom surface of the chip 14 to a thickness of about 0.1 to 10 micrometers before the chip 14 is placed in contact with the wafer 10.

In accordance with the principles of the present invention, one or more microminiature devices such as the chip 14 are adhered to the top side of the wafer 10 depicted in FIG. 2. The chip 14 is, for example, about 0.25 to 0.75 millimeters thick and includes a square top surface about six millimeters on a side. In some applications of applicants' invention, as many as 100 devices of various designs and types are mounted on the top side of the water 10.

Advantageously, the devices mounted on the wafer 10 constitute chips cut from a wafer of monocrystalline silicon whose top and bottom surfaces were parallel (100) crystalline planes of the silicon structure. Accordingly, the top and bottom surfaces of each chip mounted on the wafer 10 also lie in (100) planes. The reason for selecting this particular orientation will be evident later below when a preferential etching step included in the fabrication sequence for the assembly is described.

In accordance with the principles of applicants' invention, multiple devices of various designs and types can be mounted on the bottom, as well as on the top, of the wafer 10. This is indicated in FIG. 2 wherein a device 15 is shown mounted on the bottom side of the wafer 10 by means of adhesive layer 17.

The top of the chip 14 and the bottom of the chip 15 shown in FIG. 2 respectively constitute the so-called active sides thereof. Included on the active side of each chip are standard elements such as transistors (not shown), alignment marks (not shown), etc. Also included thereon are multiple relatively small-area conductive pads. Three such pads 18, 20, and 22 on the chip 14, and three such pads 19, 21 and 23 on the chip 15, are schematically depicted in FIG. 2. Each pad has, for example, a square surface area only about 2.5 to 10 micrometers on a side.

Importantly, the small-area pads included on the chips 14 and 15 (FIG. 2) can be located anywhere within the central region of the top surface thereof. In other words, the pads are not limited to being located along the periphery of the central region. Thus, as indicated in FIG. 2, some of the pads can be located in or towards the middle of the central region. This is advantageous because it reduces the total lead length required on a chip. As a result, the losses and delays experienced by signals that are propagated from the chip to associated circuitry are reduced. Moreover, the combination of reduced lead length and small-area pads leaves more of the active area available for other elements. Consequently, denser integrated designs are thereby made feasible.

So as not to unduly clutter the drawing, emphasis hereinafter in connection with the description of FIGS. 3 through 7 will be directed to a portion of an assembly in which a single device (the chip 14) is mounted on the top side of the wafer 10. It is to be understood, however, that what is said about the processing of the chip 14 is also applicable to the processing of one or more additional devices mounted on the top side of the wafer 10 and to the processsing of at least one additional device (such as the chip 15 of FIG. 2) mounted on the bottom side of the wafer 10.

Figure 3:
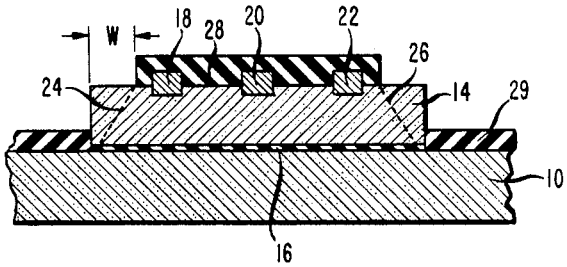
Figure 4:
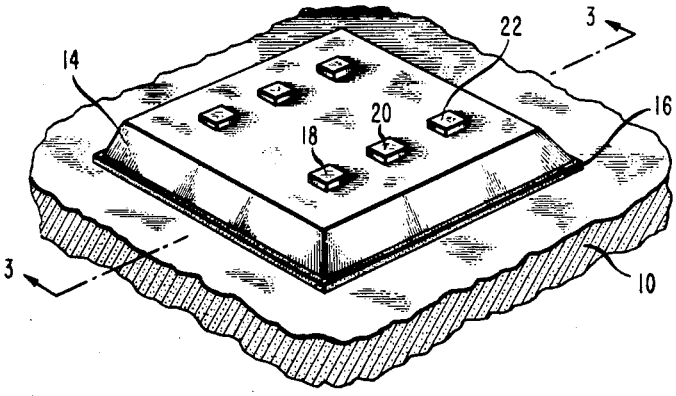

In accordance with a feature of applicants' invention, sloped edges are formed on each of the devices mounted on the wafer 10. These sloped edges extend from the perimeter of the central region of each device toward the wafer side on which the device is mounted. Advantageously, these edges are formed in a particular well-defined etching step in which each chip mounted on the wafer 10 is inherently preferentially etched to reveal (111) planes that constitute the desired sloped edges. Thus, as indicated in FIG. 3 by reference lines 24 and 26, each edge to be formed on the chip 14 will be inclined at an angle of 55 degrees with respect to the top surface of the chip 14. In that way, a peripheral band of the top surface of the chip 14 will be removed by etching. (Of course, this band need not be continuous or closed. In fact, in some cases one sloped edge per chip may be sufficient to satisfy the purposes of the invention.) In one specific illustrative embodiment, the width W (FIG. 3) of this band is about 300 to 1000 micrometers.

Advantageously, the sloped-edge chip 14 whose outline is represented in FIG. 3 is formed by selectively masking the top surface of the chip 14 and then exposing the chip to a wet etchant such as a solution of potassium hydroxide. A suitable etch-resistant mask for such an etchant is made, for example, of silicon nitride. A layer 28 of silicon nitride patterned by conventional lithographic techniques is shown in FIG. 3.

Additionally, if the wafer 10 of FIG. 3 is made of silicon, or of another material that is etched by a potassium hydroxide solution, an etch-resistant layer is also formed on the top surface of the wafer prior to defining the aforespecified sloped edges on the mounted chip(s). Such an etch-resistant layer 29 made of silicon nitride is indicated in FIG. 3. Illustratively, the layers 28 and 29 are each approximately 2000 Angstrom units thick.

An advantageous etchant for forming the aforedescribed sloped edges on the chip 14 (FIG. 2) comprises approximately 250 grams of potassium hydroxide dissolved in 0.8 liters of water and 0.2 liters of propanol. Etching for about 3 to 10 hours with such a solution is effective to form the desired sloped edges. Subsequently, the silicon nitride masking layers 28 and 29 can be removed by, for example, etching the structure in hot phosphoric acid, as is well known in the art. At that point in the fabrication sequence, an assembly made in accordance with applicants' invention appears as depicted in the perspective view of FIG. 4.

The aforespecified slope of the edges of the chip 14 is not critical. The sloped edges merely serve to facilitate the formation of runners thereon. Preferential etching, as described above, is one convenient and advantageous way of achieving such sloped edges. But other techniques may be employed to form sloped edges on the chips.

Figure 5:
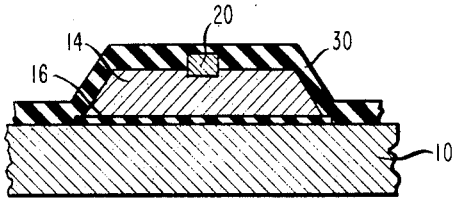

As indicated in FIG. 5, the next step in applicants' inventive fabrication sequence is to form an insulating layer 30 over the entire top surface of the depicted assembly. Illustratively, the layer 30 comprises a deposited layer of silicon dioxide about one micrometer thick.

So as to not unduly clutter the drawing, only one conductive pad 20 on the chip 14 is explicitly shown in FIG. 5. It should be understood, however, that in applicants' invention as many as 1000, or even more, small-area pads may be actually included on a typical chip.

Etching of the layer 30 is then carried out in a standard fashion utilizing conventional integrated-circuit patterning techniques to provide an opening in the layer 30 in registry with the conductive pad 20. In that way, the top surface of the conductive pad 20 is exposed, as indicated in FIG. 6.

Figure 6:
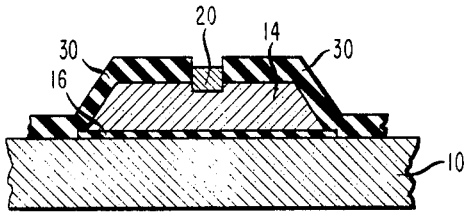

Next, a conductive layer approximately one micrometer thick made, for example, of aluminum is deposited over the entire top surface of the assembly shown in FIG. 6. The conductive layer is then patterned by conformal lithographic techniques (utilizing, for example, a germanium selenide resist) to form fine-line runners that extend from the chip pads, down one or more of the oxide-coated sloped edges of each chip and onto the main top surface of the assembly. In turn, these runners extend to conductive pads included on other mounted chips and/or to relatively large-area pads disposed around the periphery of the chip-wafer assembly.

Figure 7:
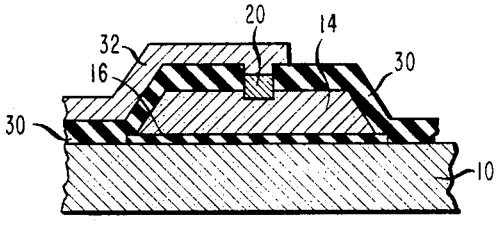

A single conductive runner 32 is represented in FIG. 7. The runner 32 contacts the pad 20 on the chip 14 and extends down one sloped edge of the chip 14 to overlie the silicon dioxide layer 30 that constitutes the main top surface of the depicted assembly.

In accordance with applicants' invention, additional alternating insulating and conductive layers (not shown) may be deposited on top of the assembly represented in FIG. 7. In that way, multi-level conductive patterns may be formed in the assembly. In some embodiments, it is advantageous to form one or more of the conductive levels as large-area planar conductors. Such planar conductors may be utilized, for example, as low-resistance low-inductance ground and/or power planes.

Figure 8:
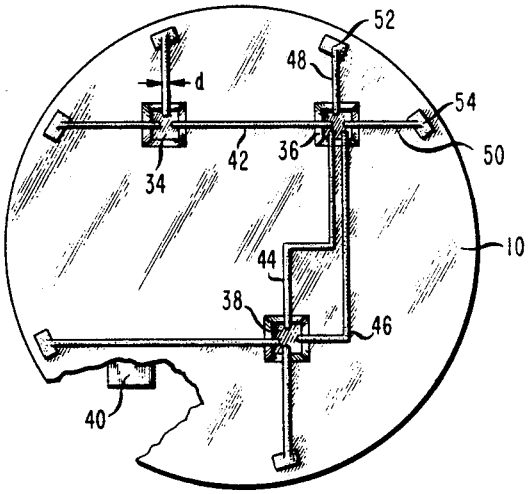

FIG. 8 is a top schematic view of a portion of an assembly made in accordance with the principles of the present invention. (A suitable standard encapsulant for the assembly may be advantageous but is not shown in FIG. 8.) For representative purposes only, four chips are indicated as being included in the depicted assembly. Three chips 34, 36 and 38 are shown mounted overlying the top of the wafer 10 and one chip 40 is represented as being mounted on the bottom of the wafer 10. (In a 150-millimeter wafer, it is feasible to include as many as 1000 mounted chips on the top and bottom of the wafer.) In practice, each such chip typically has multiple (for example, 100 or more) leads extending therefrom. So as not to unduly clutter FIG. 8, however, each top-mounted chip is shown in this simplified depiction as including at least three but not more than five leads.

Thus, for example, mounted chip 36 in FIG. 8 is represented as having five leads connected thereto. Lead 42 of the chip 36 extends to adjacent chip 34. Leads 44 and 46 interconnect the chips 36 and 38. Additionally, leads 48 and 50 respectively extend between the chip 36 and peripheral conductive pads 52 and 54.

In one specific illustrative embodiment of applicants' invention, each of the interconnecting leads shown in FIG. 8 has a width d of approximately 1 to 10 micrometers. By way of example, each of the peripheral pads shown therein is about 1.25 by 1.25 millimeters. By a variety of conventional techniques, it is a relatively easy matter to establish electrical connections between such large-area peripheral pads and similar assemblies and/or other components included in an overall electronic system.

It is noted that this application is being filed concurrently with a related commonly assigned application designated K. K. Ng-S. M. Sze application Ser. No. 581,259, now U.S. Pat. No. 4,613,891. In one embodiment described in the related application, devices such as chips containing contact pads are mounted, active side up, on the bottom surface of a wafer. A through-aperture containing at least one sloped wall is then formed in the wafer in registry with each mounted chip. A conductive pattern, including runners extending up the sloped wall(s), is then formed to connect the pads to other chip pads and/or to peripherally disposed conductive elements on the wafer.

Finally, it is to be understood that the above-described structures and processing techniques are only illustrative of the principles of the present invention. In accordance with these principles, numerous modifications and alternatives may be devised by those skilled in the art without departing from the spirit and scope of the invention. For example, in accordance with applicants' inventive principles, it is feasible to selectively interconnect device pads and/or peripheral pads on the top and bottom of the wafer by forming conductors that extend through via holes in the wafer. Moreover, it is feasible to fabricate composite chip-wafer assemblies that embody both the concepts described herein and those described in the aforecited related application. In such a composite assembly, sloped-wall chips and straight-wall chips would be mounted on both sides of a wafer that contains sloped-wall through apertures.

Also, it is to be understood that the wafer 10 may be made of a material other than silicon. In selecting an alternative material, factors such as matching the thermal properties of the wafer to those of the associated chips are to be considered.

It is noted that assemblies related to those disclosed herein are described in two commonly assigned copending U.S. applications being filed concurrently herewith. These related applications are designated Ser. No. 582,079 and Ser. No. 581,260, now abandoned. Additionally, commonly assigned copending U.S. application Ser. No. 581,258 contains subject matter related to that disclosed herein.

The aforeidentified Blahut application discloses a system organization in which multiple semiconductor chips are formed in or attached to a semiconductor wafer. Illustratively, the assemblies described herein are suited for being organized and implemented in the particular manner described in the Blahut application.

More specifically, the Blahut application describes a carrier (wafer) with a plurality of circuits (chips) being formed therein or attached thereto with some of the circuits being coupled together via a signal conduit path. Illustratively, the carrier and at least some of the circuits are of the same material. Each of the component circuits is adapted to have a priority with respect to the transmission of information onto the signal conduit path. A plurality of arbitration conduit paths exists. Each of the component circuits, except for possibly the component circuit having the lowest priority, comprises a separate one of a plurality of arbitration request circuits. Each arbitration request circuit is coupled to a separate one of the arbitration conduit paths and is adapted to selectively allow a signal from its component circuit to reach the arbitration conduit path coupled thereto. Each of the component circuits, except for possibly the component circuit having a highest priority, comprises a separate one of a plurality of arbitration circuits. Each arbitration circuit is coupled to at least one of the arbitration conduit paths and is adapted to detect which of any of the other component circuits having a higher priority is requesting access to the signal conduit path and to enable its component circuit to gain access to the signal conduit path if its component circuit is requesting access to the signal conduit path and if its component circuit has a higher priority than any other component circuit which is requesting such access.

What is claimed is:

1. An assembly comprising a wafer having top and bottom surfaces, said top surface constituting a planar uppermost surface of said wafer and said bottom surface constituting a planar bottommost surface of said wafer, said wafer having conductive terminal portions on said top surface, at least one microminiature device mounted on the top surface of said wafer, said device having a top surface and including conductive elements in a central portion of the top surface of said device, each device mounted on the top surface of said wafer having at least one sloped edge extending from said central portion toward the top surface of said wafer, and a conductive pattern connecting the elements of each device mounted on the top surface of said wafer to said terminal portions, said pattern being disposed entirely on the sloped edge of each device and on the top surface of said wafer.

2. An assembly as in claim 1 wherein said at least one microminiature device comprises an integrated circuit device including a monocrystalline silicon chip.

3. An assembly as in claim 2 wherein the top and bottom surfaces of said silicon chip lie in (100) crystalline planes.

4. An assembly as in claim 3 wherein said at least one sloped edge lies in a (111) crystalline plane of said silicon chip.

5. An assembly as in claim 4 wherein an adhesive layer is interposed between each device and said wafer.

6. An assembly as in claim 1 wherein said wafer includes additional conductive terminal portions on said bottom surface, at least one microminiature device mounted on the bottom surface of said wafer, said device having an unmounted surface and including conductive elements in a central portion of its unmounted surface, each device mounted on the bottom surface of said wafer having at least one sloped edge extending from its central portion toward the bottom surface of said wafer, and a conductive pattern connecting the elements of a device mounted on the bottom surface of said wafer to said additional terminal portions, said pattern being disposed entirely on the sloped edge of each device mounted on the bottom surface of said wafer and on the planar bottom surface of said wafer.

7. A method of fabricating an assembly that comprises a wafer and at least one wafer-mounted microminiature device that includes conductive elements in a central portion of the active surface of the device, the wafer having planar top and bottom surfaces, said method comprising the steps of mounting said at least one device, active side up, on the top surface of said wafer, forming at least one sloped edge on said mounted device extending from the central portion of said device toward the top surface of said wafer, and forming a conductive pattern overlying the top surface of said wafer and said sloped edge to connect the elements of said mounted device to conductive elements on at least one other wafer-mounted device and to peripherally disposed terminal portions of said conductive pattern.

8. A method as in claim 7 wherein said at least one microminiature device comprises an integrated circuit device including a monocrystalline silicon chip.

9. A method as in claim 8 wherein the top and bottom surfaces of said silicon chip lie in (100) crystalline planes.

10. A method as in claim 9 wherein said forming step comprises etching peripheral portions of said at least one silicon chip to establish said at least one sloped edge in a (111) crystalline plane of said chip.

11. A method as in claim 10 wherein the central portion of said at least one silicon chip is protected with an etch-resistant layer of silicon nitride and etching is carried out with an anisotropic etch such as a potassium hydroxide solution.

12. A method as in claim 11 wherein, subsequent to etching, said etch-resistant layer is removed.

13. A method as in claim 12 wherein an insulating layer is next deposited over the entire top surface of said assembly.

14. A method as in claim 13 wherein said insulating layer is patterned to form openings therethrough in respective registry with said conductive elements.

15. A method as in claim 14 wherein a patterned conductive layer is formed overlying said insulating layer and in said openings to form said peripherally disposed terminal portions and a network of leads interconnecting said elements and said terminal portions.

16. A method as in claim 7 wherein during said mounting and forming steps at least one sloped-edge microminiature device with centrally positioned conductive elements is mounted, active side down, on the bottom side of said wafer and connections are established from said last-mentioned elements to conductive elements on at least one other bottom-mounted device and to peripherally disposed terminal portions of a conductive pattern formed overlying the bottom side of said wafer.

17. A method as in claim 16 wherein connections are also established between conductive elements and terminal portions on one side of said wafer and conductive elements and terminal portions on the other side of said wafer.

18. An assembly made by the method of claim 7.

19. An assembly as in claim 18 wherein each of said wafer-mounted devices includes circuits formed in the central portion of the top surface of the device, and wherein said conductive pattern includes a signal conduit path and a plurality of arbitration conduit paths, a plurality of the devices being coupled to said signal conduit path and selectively needing to transmit information onto said signal conduit path, the wafer and at least some of said devices being of essentially the same material, wherein each of the devices is adapted to have a priority with respect to transmission of information onto the signal conduit path, wherein each of the devices, comprises a separate one of a plurality of arbitration request circuits, wherein each arbitration request circuit is coupled to a separate one of the arbitration conduit paths and is adapted to selectively allow a signal from its device to reach the arbitration signal conduit path coupled thereto, wherein each of the devices, comprises a separate one of a plurality of arbitration circuits, and wherein each arbitration circuit is coupled to at least one of the arbitration conduit paths and is adapted to detect which of any of the other devices having a higher priority is requesting access to the signal conduit path and to enable its device to gain access to the signal conduit path if its device is requesting access to the signal conduit path and if its device has a higher priority than any other device which is requesting such access.

* * * * *